United States Patent
Kar et al.

(10) Patent No.: US 9,425,326 B2
(45) Date of Patent: Aug. 23, 2016

(54) VERTICAL MEMORY DEVICE AND METHOD FOR MAKING THEREOF

(75) Inventors: Gouri Sankar Kar, Heverlee (BE); Antonino Cacciato, Heverlee (BE)

(73) Assignee: IMEC, Leuven (BE)

( * ) Notice: Subject to any disclaimer, the term of this patent is extended or adjusted under 35 U.S.C. 154(b) by 74 days.

(21) Appl. No.: 13/981,248

(22) PCT Filed: Jan. 24, 2012

(86) PCT No.: PCT/EP2012/051019
§ 371 (c)(1),
(2), (4) Date: Sep. 12, 2013

(87) PCT Pub. No.: WO2012/101107
PCT Pub. Date: Aug. 2, 2012

(65) Prior Publication Data
US 2013/0341702 A1 Dec. 26, 2013

Related U.S. Application Data

(60) Provisional application No. 61/435,675, filed on Jan. 24, 2011.

(51) Int. Cl.
*H01L 29/792* (2006.01)
*H01L 29/66* (2006.01)
*H01L 29/10* (2006.01)

(52) U.S. Cl.
CPC .......... *H01L 29/792* (2013.01); *H01L 29/1045* (2013.01); *H01L 29/66666* (2013.01); *H01L 29/66833* (2013.01); *H01L 29/7926* (2013.01)

(58) Field of Classification Search
CPC ...................... H01L 29/66666; H01L 29/7926; H01L 29/7371; H01L 29/7395; H01L 29/7827; H01L 29/7889; H01L 29/7869; H01L 29/66712; H01L 21/823487; H01L 21/823885; H01L 21/8224; H01L 27/11273; H01L 27/2454
USPC .................... 257/242, 263, 324, 329; 438/268
See application file for complete search history.

(56) References Cited

U.S. PATENT DOCUMENTS

| | | | | |
|---|---|---|---|---|
| 6,060,746 A | * | 5/2000 | Bertin et al. | 257/331 |
| 2003/0060015 A1 | * | 3/2003 | Layman et al. | 438/275 |

(Continued)

FOREIGN PATENT DOCUMENTS

EP 0513923 11/1992

OTHER PUBLICATIONS

Tanaka, H. et al., "Bit Cost Scalable Technology with Punch and Plug Process for Ultra High Density Flash Memory", 2007 IEEE Symposium on VLSI Technology, Jun. 12-14, 2007, pp. 14-15.

(Continued)

*Primary Examiner* — Matthew W Such
*Assistant Examiner* — David Spalla
(74) *Attorney, Agent, or Firm* — McDonnell Boehnen Hulbert & Berghoff LLP

(57) ABSTRACT

Described herein is a method for forming a vertical memory device (150) having a vertical channel region (113) sandwiched between a source region (109, 112) and a drain region (114). A charge trapping layer (106) is provided either side of the vertical channel region (113) and associated source and drain regions (109, 112, 114). The source region (109, 112) comprises a junction between a first region (109) comprising a first doping type with a first doping concentration and a second region (112) comprising a second doping type which is opposite to the first doping type and with a second doping concentration. The drain region (114) comprises the first doping type with a first doping concentration. In another embodiment, the drain region has two regions of differing doping types and concentrations and the source region comprises the first doping type with the first doping concentration.

19 Claims, 12 Drawing Sheets

(56) References Cited

U.S. PATENT DOCUMENTS

2006/0202251 A1* 9/2006 Bhattacharyya ...... H01L 27/115 257/314
2007/0158736 A1* 7/2007 Arai et al. ..................... 257/315
2007/0252201 A1 11/2007 Kito et al.

OTHER PUBLICATIONS

Jang, Jaehoon et al., "Vertical Cell Array Using TCAT (Terabit Cell Array Transistor) Technology for Ultra High Density NAND Flash Memory", 2009 Symposium on VLSI Technology, Jun. 16-18, 2009, pp. 192-193.

Katsumata, Ryota et al., "Pipe-Shaped BiCS Flash Memory With 16 Stacked Layers and Multi-Level-Cell Operation for Ultra High Density Storage Devices", 2009 Symposium on VLSI Technology, Jun. 16-18, 2008, pp. 136-137.

Whang, SungJin et al., "Novel 3-Dimensional Dual Control-Gate with Surrounding Floating-Gate (DC-SF) NAND Flash Cell for 1Tb File Storage Application", 2010 IEEE International Electron Device Meeting (IEDM), Dec. 6-8, 2010, pp. 29.7.1-29.7.4.

PCT International Search Report and Written Opinion, PCT International Application No. PCT/EP2012/051019 dated Apr. 17, 2012.

* cited by examiner

VERTICAL MEMORY DEVICE AND METHOD FOR MAKING THEREOF

BACKGROUND OF THE INVENTION

1. Field of the Invention

The present invention relates to a vertical memory device and the method for making thereof.

2. Description of the Related Technology

With NAND Flash memory requiring higher densities and higher read/write throughput, and with traditional memory cell scaling reaching hard limits, vertical or 3D scaling approaches are being investigated. Bit-Cost Scalable (BiCS), Pipe-Shaped BiCS (P-BiCS), Terabit Cell Array Transistors (TCAT) and Dual Control-Gate with Surrounding Floating-Gate (DC-SF) appear to provide the most promising solutions to the requirement of higher densities and read/write throughput as described by H Tanaka et al., VLSI 2007, page 14, by R Katsumata et al., VLSI 2009, page 136, J Jang et al., VLSI 2009, page 192 and S Whang, IEDM 2010, page 669.

BiCS is the simplest approach, but a major drawback with this approach is the difficulty to be able to create a junction at the bottom of the memory hole. The exposed tunnel oxide is attacked during dry etch of the gate stack at the bottom and also by diluted HF (DHF) clean. DC-SF faces the same problem, and to avoid bottom junction formation, complicated pipeline construction (P-BiCS) or expensive gate replacement technology (TCAT) is required. The latter concepts are not optimal in terms of density, because of pipeline and word line separation respectively.

There is therefore a need to provide a method of constructing a vertical memory cell which solves the problem of tunnel oxide integrity.

SUMMARY OF CERTAIN INVENTIVE ASPECTS

It is therefore an object of the present invention to provide a vertical memory cell which provides higher densities and higher read/write throughput that does not suffer from the known problem associated with tunnel oxide integrity.

It is a further object of the present invention to provide a method for forming such a vertical memory cell.

In accordance with a first aspect of the present invention, there is provided a method for forming a vertical memory device, the method comprising the steps of:

a) providing a semiconductor substrate;

b) providing at least a first top layer on the semiconductor substrate to form a semiconducting substrate, the first top layer comprising dopants of a first doping type and with a first doping concentration;

c) providing a stack of layers on the semiconducting substrate, the stack of layers comprising at least a first dielectric layer, a second dielectric layer and a conductive layer sandwiched in between the first and second dielectric layers;

d) providing a hole in the stack of layers to expose a part of the semiconducting substrate, the hole comprising a sidewall surface and a bottom surface;

e) providing a gate dielectric layer at the sidewall surfaces of the hole;

f) providing a semiconducting material in the hole and on top of the second dielectric layer;

g) providing a first annealing step to form a bottom region in a bottom part of the hole, the bottom region comprising at least dopants of the first doping type and forming a junction with a middle part of the hole serving as a channel region; and h) providing a second annealing step to form a top region in a top part of the hole, the top region comprising at least dopants of the first doping type and forming a junction with the channel region;

characterised in that one of: steps b) and f) comprises providing a material layer comprising dopants of a second doping type with a second doping concentration, the second doping type being opposite to the first doping type, the material layer forming a second region in one of the bottom region and the top region;

and in that the second region forms a junction with a first region of one of the bottom region and the top region at the junction with the channel region.

In one embodiment of the present invention, the material layer of the second doping type is used to form a source region at the bottom of the hole adjacent the channel region. In this case, the material if formed as a second top layer over the first top layer of the semiconducting substrate prior to the formation of the stack of layers on the semiconducting substrate.

In another embodiment of the present invention, the material of the second doping type is used to form a drain region at the top of the hole adjacent the channel region. In this case, the material is introduced into the top of the hole prior to the second annealing step.

In further embodiments of the present invention, the source region may be formed at the top of the hole and the drain region may be formed at the bottom of the hole. In addition, the source region at the top of the hole may form a junction with the channel region by way of a region of the second doping type. Similarly, the drain region at the bottom of hole may form a junction with the channel region by way of a region of second doping type.

A first inventive aspect relates to a method for forming a vertical memory device, the method comprising:—providing a semiconductor substrate; providing a first top layer in the semiconductor substrate, the first top layer comprising dopants with a first doping type and first doping concentration; providing a second top layer in the first top layer, the second top layer comprising dopants with a second doping type being opposite to the first doping type and a second doping concentration; providing a stack of layers on the semiconducting substrate, the stack of layers comprising at least a bottom dielectric layer, a top dielectric layer and a conductive layer in sandwiched in between the top and bottom dielectric layer; providing a hole in the stack of layers thereby exposing part of the semiconducting substrate, the hole comprising a sidewall surface and a bottom surface; providing a gate dielectric layer at the sidewall surfaces of the hole; providing a semiconducting material in the hole and on top of the hole and top dielectric layer; providing a first annealing step thereby forming a source region in a bottom part of the hole, the source region comprising a junction between a first source region comprising dopants of the first doping type and a second source region comprising dopants of the second doping type, the second source region being in contact with the middle channel region; and providing a second annealing step thereby forming a drain region in a top part of the hole, the drain region comprising dopants of the first doping type, thereby forming a junction with a middle part of the hole serving as the channel region.

A second inventive aspect relates to a method for forming a vertical memory device, the method comprising:—providing a semiconductor substrate; providing a first top layer in the semiconductor substrate, the first top layer comprising dopants with a first doping type and first doping concentration; providing a stack of layers on the semiconducting substrate, the stack of layers comprising at least a bottom dielectric layer, a top dielectric layer and a conductive layer in sandwiched in between the top and bottom dielectric layer; providing a hole in the stack of layers thereby exposing part of the semiconducting substrate, the hole comprising a sidewall surface and a bottom surface; providing a gate dielectric layer at the sidewall surfaces of the hole; providing a semiconducting material in the hole and on top of the hole and top dielectric layer; providing in the semiconducting material at the top of the hole dopants with the first doping type and doping concentration; providing a first annealing step thereby forming a source region in a bottom part of the hole, the source region comprising dopants of the first doping type, thereby forming a junction with a middle part of the hole serving as the channel region; providing in the semiconducting material at the top of the hole dopants with a second doping type being opposite to the first doping type and doping concentration; and providing a second annealing step thereby forming a drain region in a top part of the hole, the drain region comprising a junction between a first drain region comprising dopants of the first doping type and a second drain region comprising dopants of the second doping type, the second drain region being in contact with the middle channel region.

In accordance with another aspect of the present invention, there is provided a vertical memory device comprising:—
a semiconductor substrate;
a vertical semiconducting region formed on the semiconductor substrate, the vertical semiconducting region comprising a source region, a drain region and a channel region vertically sandwiched in between the source region and drain region;
a horizontal stack formed adjacent the vertical channel semiconducting region, the horizontal stack comprising a conductive gate layer sandwiched in between a first dielectric layer and a second dielectric layer; and
a charge trapping layer formed along a sidewall of the vertical semiconducting region and in between the vertical semiconducting region and the conductive gate layer;
characterised in that one of the source and the drain regions comprises a junction between a first region and a second region, the second region being located closest to the channel region, the first region comprising a first doping type with a first doping concentration and the second region comprising a second doping type with a second doping concentration, the second doping type being opposite to the first doping type.

In one embodiment, the source region comprises the junction between the first region and the second region. In this case, the drain region comprises the first doping type with the first doping concentration.

In another embodiment, the drain region comprises the junction between the first region and the second region. In this case, the source region comprises the first doping type with the first doping concentration.

The first doping type may comprise an n-type dopant, for example, phosphorus or arsenic. The second doping type may comprise a p-type dopant, for example, boron.

Preferably, the channel region is undoped.

BRIEF DESCRIPTION OF THE DRAWINGS

For a better understanding of the present invention, reference will now be made, by way of example only, to the accompanying drawings in which:—

DETAILED DESCRIPTION OF CERTAIN ILLUSTRATIVE EMBODIMENTS

Figure 1:
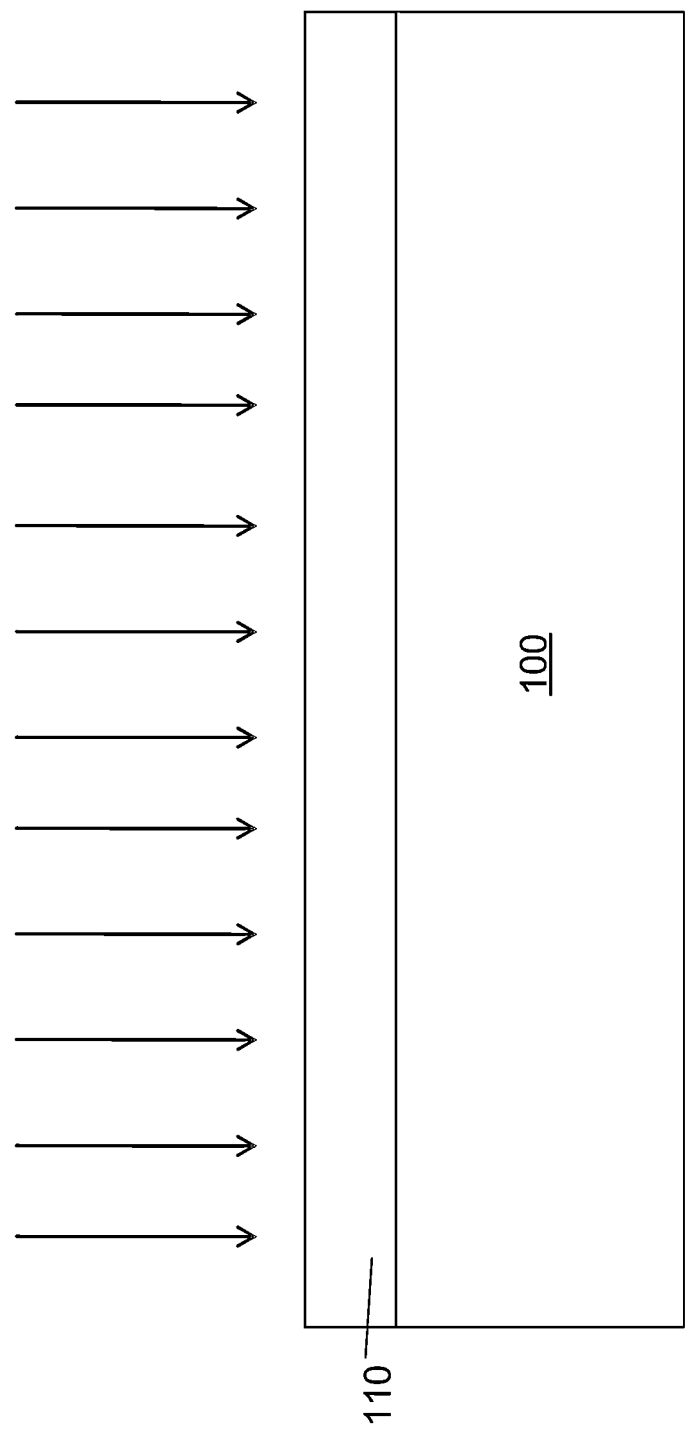
FIGS. 1 to 9 illustrate respective steps in the formation of a vertical memory device in accordance with one embodiment of the present invention.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

It will be understood that the terms "vertical", "horizontal", "top" and "bottom" are used herein refer to particular orientations of the Figures and these terms are not limitations to the specific embodiments described herein.

Although the present invention will be described with reference to a vertical memory device and a method of making such a device, it will readily be appreciated that the present invention can also apply to a vertical non-volatile memory device and the method for making thereof.

FIG. 1 illustrates a semiconductor substrate 100, for example, a silicon substrate, on which a first layer 110 has been formed. The semiconductor substrate 100 comprises a crystalline semiconducting material which is preferably monocrystalline (or single crystalline), such as for example, monocrystalline Si. Alternatively, the semiconductor substrate 100 may comprise a polycrystalline material or may be amorphous.

By the term "monocrystalline" or "singe crystalline" is meant a material in which the crystal lattice of the entire sample is continuous and unbroken to the edges of the sample, with no grain boundaries.

By the term "polycrystalline" is meant a material comprising multiple small material crystals. For example, polycrystalline silicon is a material consisting of multiple small silicon crystals.

By the term "amorphous" is meant the non-crystalline allotropic form of the material. For example, silicon may be amorphous (a-Si), monocrystalline or polycrystalline.

The material from which the semiconductor substrate 100 is made may be undoped, that is, having no dopants or doping material present to change its properties, or may be lightly doped to a concentration of about 1e15 at/cm$^3$. The term "1e15 at/cm$^3$" refers to a doping concentration of $1 \times 10^{15}$ atoms per cm$^3$, and 2e15 at/cm$^3$ etc. refer to doping concentrations of $2 \times 10^{15}$ atoms per cm$^3$, etc.

The first top layer 110 comprises a material with dopants of a first doping type with a first doping concentration. Doping may be achieved by implanting the dopants of the first doping type and the first doping concentration into the first top layer 110. For example, phosphorus atoms, being n-type, may be implanted in the first top layer with a doping concentration of about 1 to 2e15 at/cm$^3$. The implantation of dopants may be performed with an ion implantation technique well known for a person skilled in the art as indicated by the arrows in FIG. 1. In a later step of the manufacturing process, these dopants will be diffused into other layers of the device as described in detail below. The implantation depth may be in the range of about 15 to 20 nm.

Figure 2:
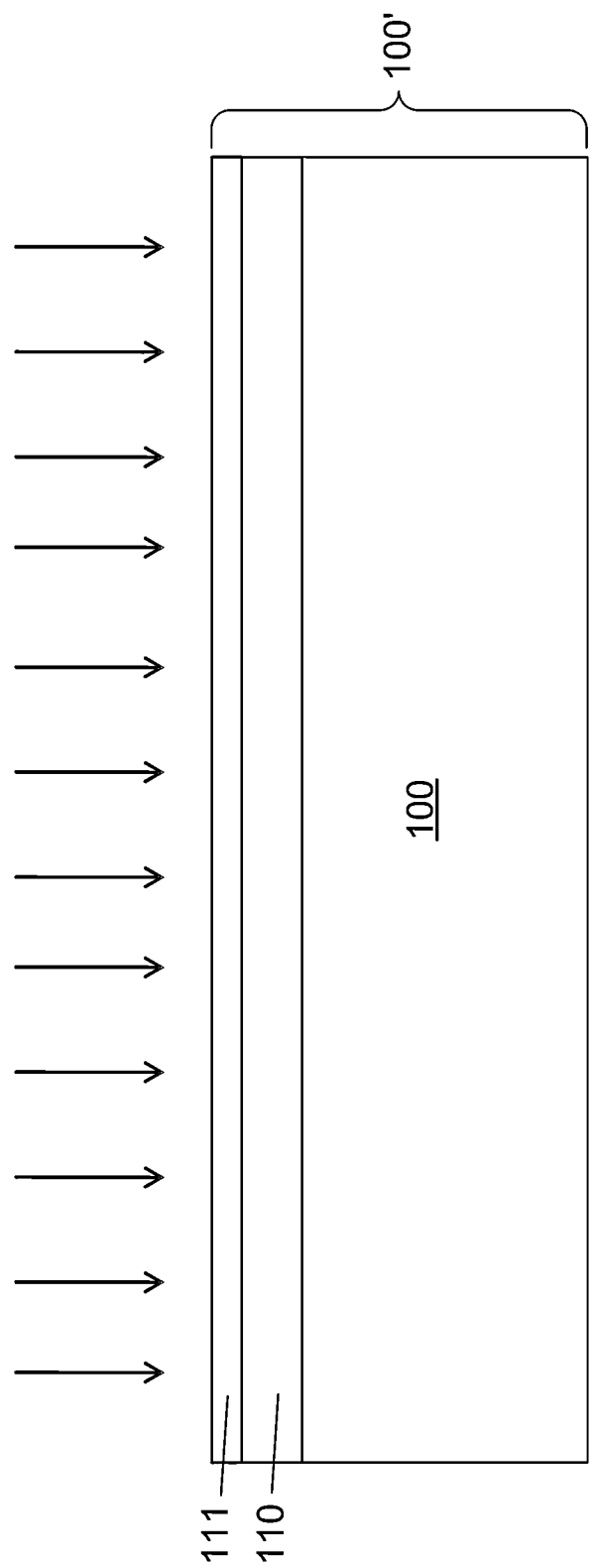

In a second implantation step as shown in FIG. 2, a second top layer 111 is provided in the semiconductor substrate 100, more specifically, on top of the first top layer 110. The second top layer 111 comprises dopants of a second doping type with a second doping concentration.

Doping may be achieved by implanting the dopants of the second doping type and the second doping concentration into the second top layer 111. The second doping type is opposite to the first doping type. The second doping concentration may be comparable to the first doping concentration, but may be either higher or lower than the first doping concentration. However, the second doping concentration should not be lower than 30 to 50 percent of the first doping concentration. For example, boron atoms, being p-type, may be implanted in the second top layer with a doping concentration of about 1 to 2e15 at/cm$^3$. The implantation of dopants may be performed with an ion implantation technique well known for a person skilled in the art as indicated by the arrows in FIG. 2. In a later step of the manufacturing process, these dopants will be diffused as will be described in more detail below.

The semiconductor substrate 100 and the first and second top layers 110, 111 together form a doped semiconducting substrate 100' on which a vertical memory device in accordance with the present invention is formed.

The implantation depth of the second top layer 111 may be in the same range as the implantation depth of the first top layer 110.

If, for example, a first implantation with phosphorus P (n-type) and a second implantation with boron B (p-type) is performed, the boron will diffuse more than the phosphorus during an annealing step into a channel (which may comprise, for example, polysilicon) which is filling a hole (as will be described in more detail below), thus increasing the boron concentration in the tail of phosphorus distribution. This will create a sharper junction between the region where the first and second dopants are implanted and the channel region in which gate-induced drain leakage (GIDL) will be increased.

Figure 11B:
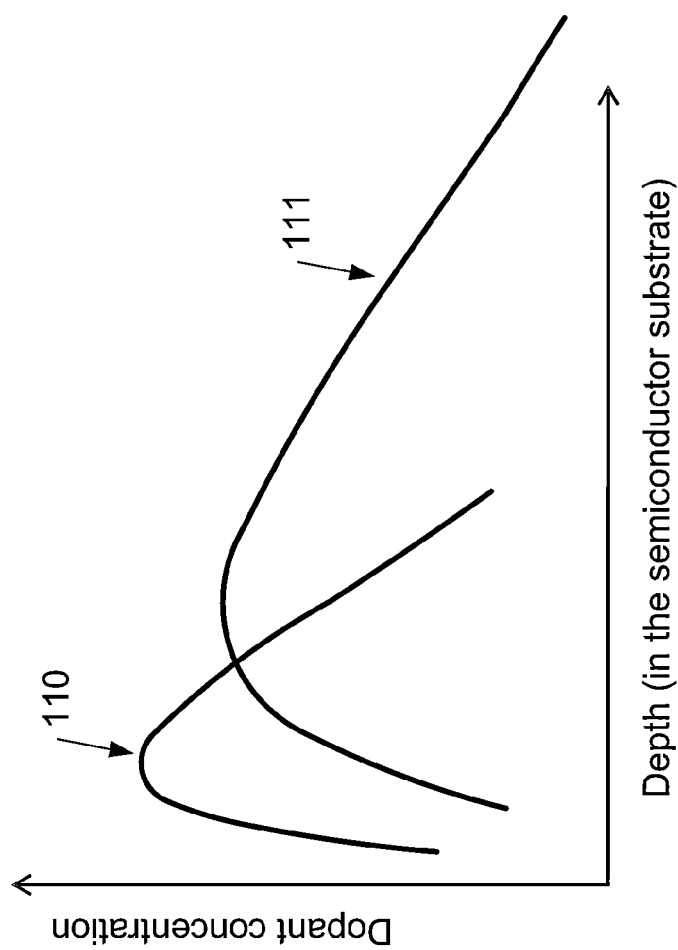
FIGS. 11a and 11b illustrate respectively graphs of dopant concentrations against depth in the semiconductor substrate before and after annealing.
Figure 11A:
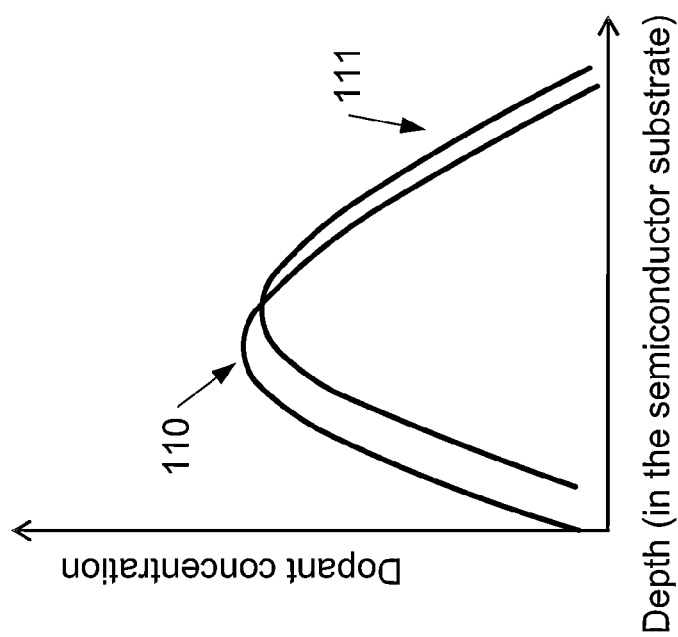

A schematic graph for the dopant concentration as a function of the depth in the doped semiconducting substrate 100' of the first and the second implantation step in before and after the annealing step is shown in FIG. 11a and FIG. 11b respectively. Before annealing, FIG. 11a, the doping profiles of the first and second doping type are more or less equivalent. After annealing, the dopants of the second implantation dopant type 111 will diffuse further than the dopants of the first implantation dopant type 110. The diffusion is towards the channel region as will be described in more detail below.

Figure 3:
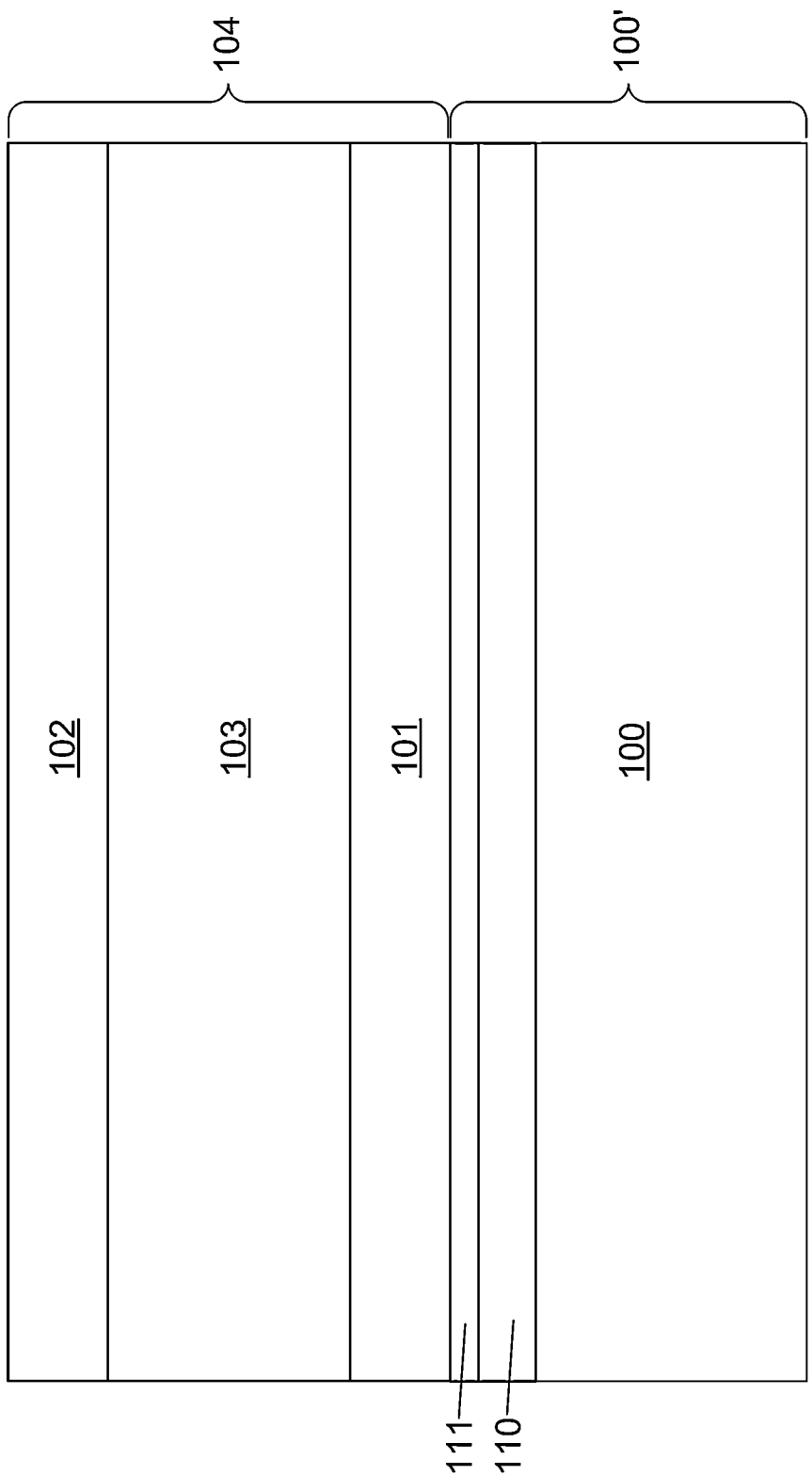

After the first and second implantation step, a stack 104 of layers is provided on the second top layer 111 of the doped semiconducting substrate 100'. The stack 104 of layers comprises at least a first or bottom dielectric layer 101, a second or top dielectric layer 102 and a conductive layer 103 sandwiched in between the first or top dielectric layer 102 and the second or bottom dielectric layer 101 as shown in FIG. 3.

The stack 104 of layers 101, 102, 103 may be formed using standard deposition techniques well known for a person skilled in the art, such as, for example, chemical vapour phase deposition (CVD) or plasma enhanced CVD (PECVD).

Figure 4:
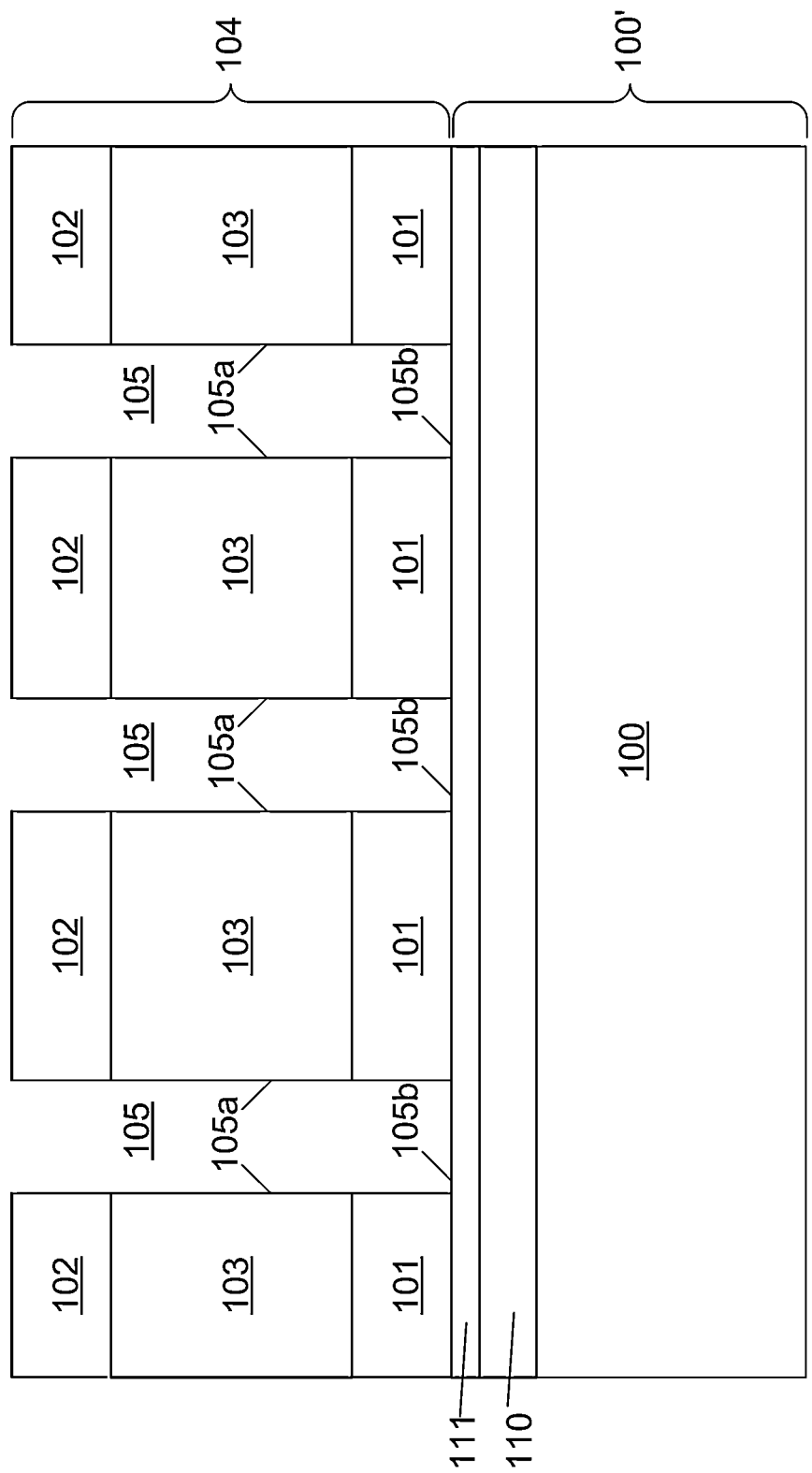

In a next step as shown in FIG. 4, at least one hole or trench 105 is provided through the stack 104 of layers 101, 102, 103 thereby exposing part of the second top layer 111 formed on the underlying semiconducting substrate 100. Each hole or trench 105 comprises a sidewall surface 105a and a bottom surface 105b. In each hole or trench 105, a channel of a vertical memory device in accordance with the present invention will be formed. In one embodiment, the holes or trenches comprise memory holes or plugs for a transistor channel. The formation of each hole or trench 105 may be achieved using standard process techniques well known for a person skilled in the art, such as, for example, lithography. In such a lithograph step, a hard mask layer (not shown) is formed on the stack 104 of layers 101, 102, 103 and a photo-resist layer (also not shown) is formed on the hard mask layer, the hard mask layer is patterned by exposing and etching the photo-resist layer, and, after removing the photo-resist layer, one or more vertical holes or trenches 105 are formed in the stack 104 of layers 101, 102, 103 by etching therethrough using the hard mask layer. Once the holes or trenches have been formed, the hard mask layer is removed.

Figure 5:
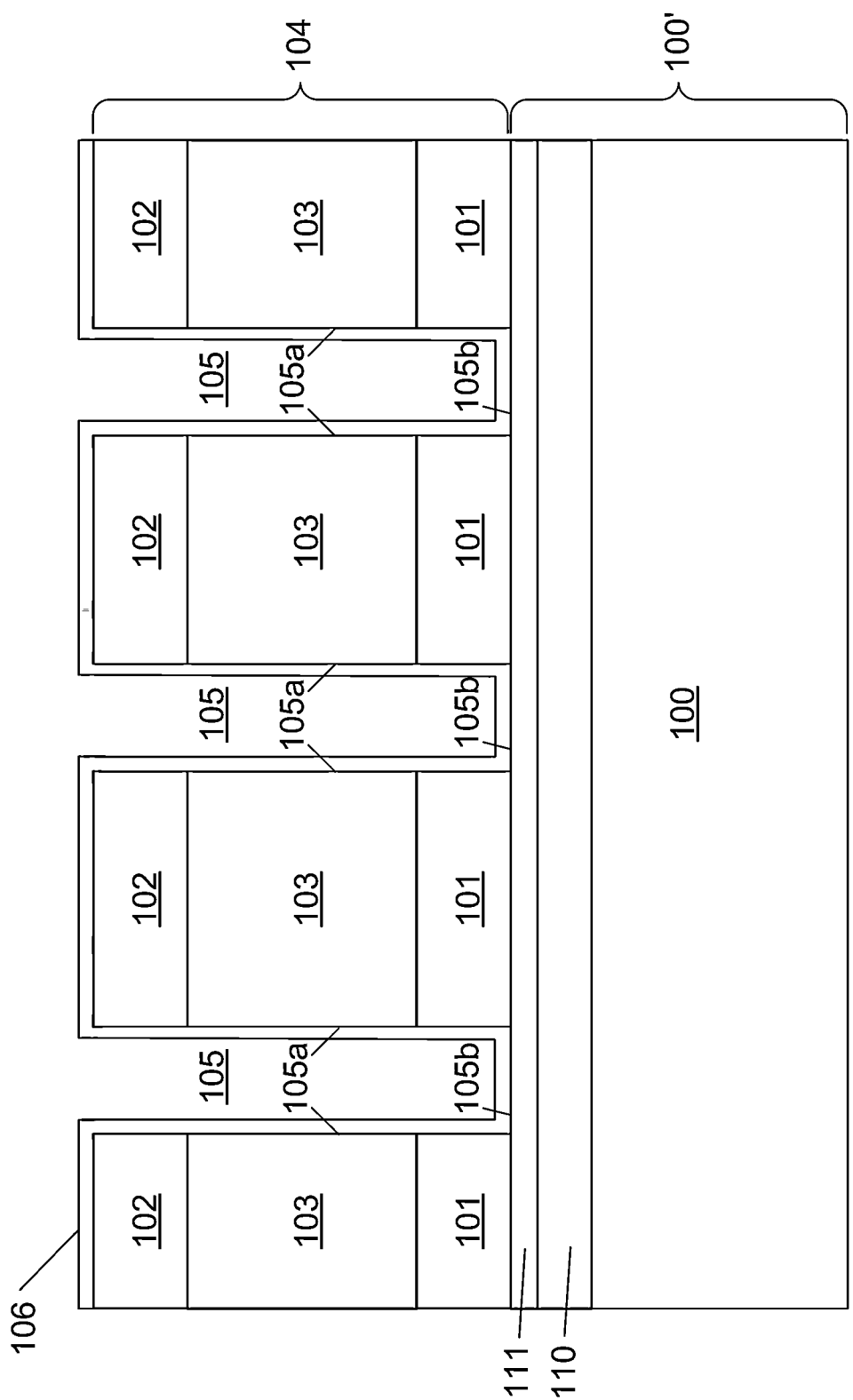
Figure 6:
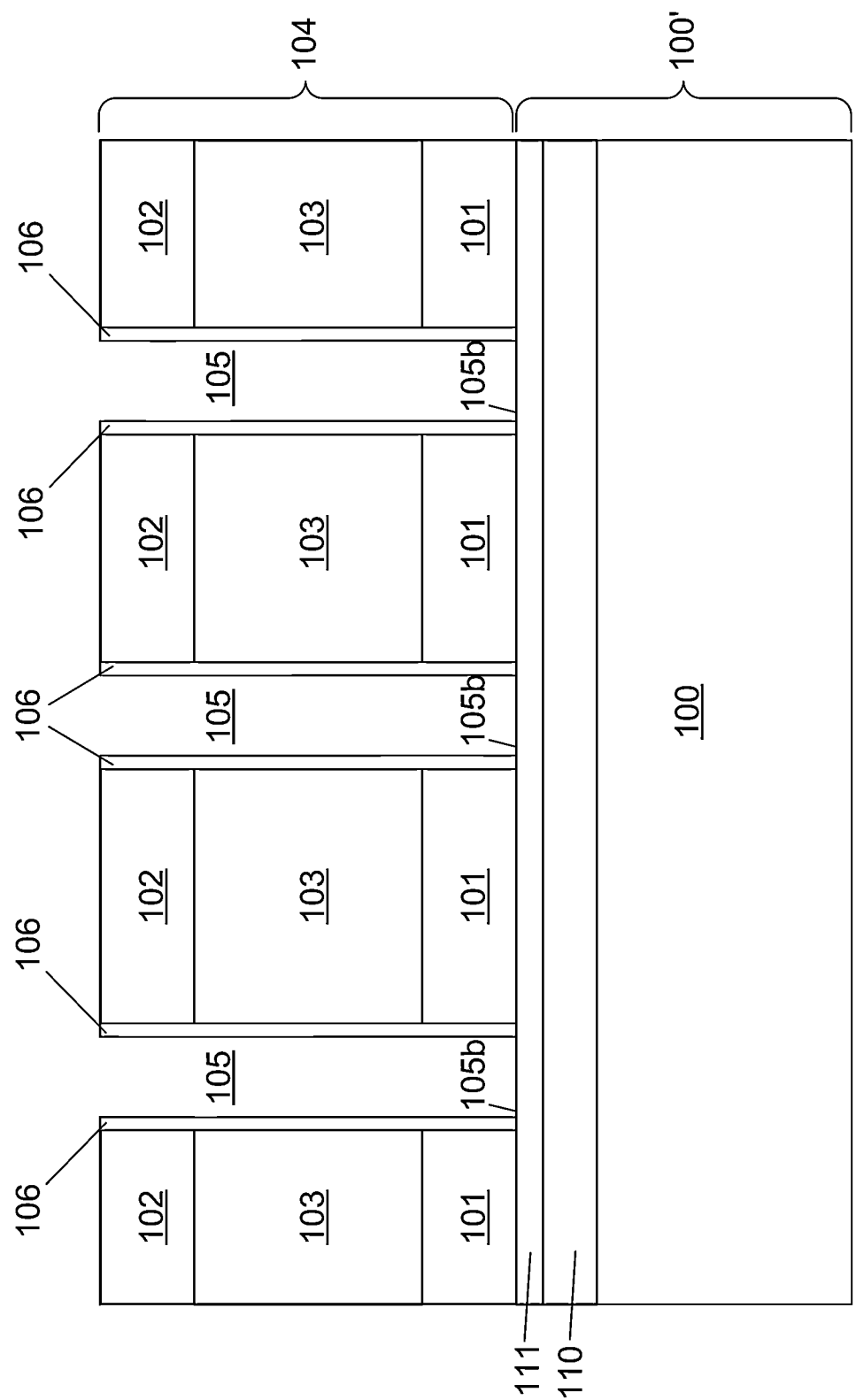

After formation of the holes or trenches 105, that is, the vertical holes, a gate dielectric layer 106 is formed at the sidewall surface 105a of each hole or trench 105 as shown in FIG. 5. The gate dielectric layer 106 may be first formed on the top of the stack 104, and on the sidewall surface 105a and the bottom surface 105b of each hole 105 as shown in FIG. 5, with the top portion being subsequently removed as shown in FIG. 6. FIG. 6 also shows that the portion of the dielectric layer 106 at the bottom surface 105b of the hole 105 has also been removed.

The gate dielectric layer 106 may comprise a stack of dielectric layers (not shown), and preferably comprises a first dielectric layer with a large density of charge traps, typically 1e19 traps/cm$^3$, sandwiched in between two other dielectric layers with a substantially lower density of charge traps compared to the first dielectric layer. The term "1e19 traps/cm$^3$" refers to $10^{19}$ traps/cm$^3$, that is, the number of traps per cm$^3$ of material.

Preferably, the gate dielectric layer 106 comprises a nitride-containing dielectric layer sandwiched in between two oxygen-containing dielectric layers. The gate dielectric layer 106 may, for example, be a stack formed by a $Si_3N_4$ layer sandwiched in between two $SiO_2$ layers. The gate dielectric layer 106 is also often referred to as the ONO stack. The gate dielectric layer 106 will serve as the gate dielectric in between a conductive layer (not formed yet) and a channel region (which will be formed in the trench).

Figure 7:
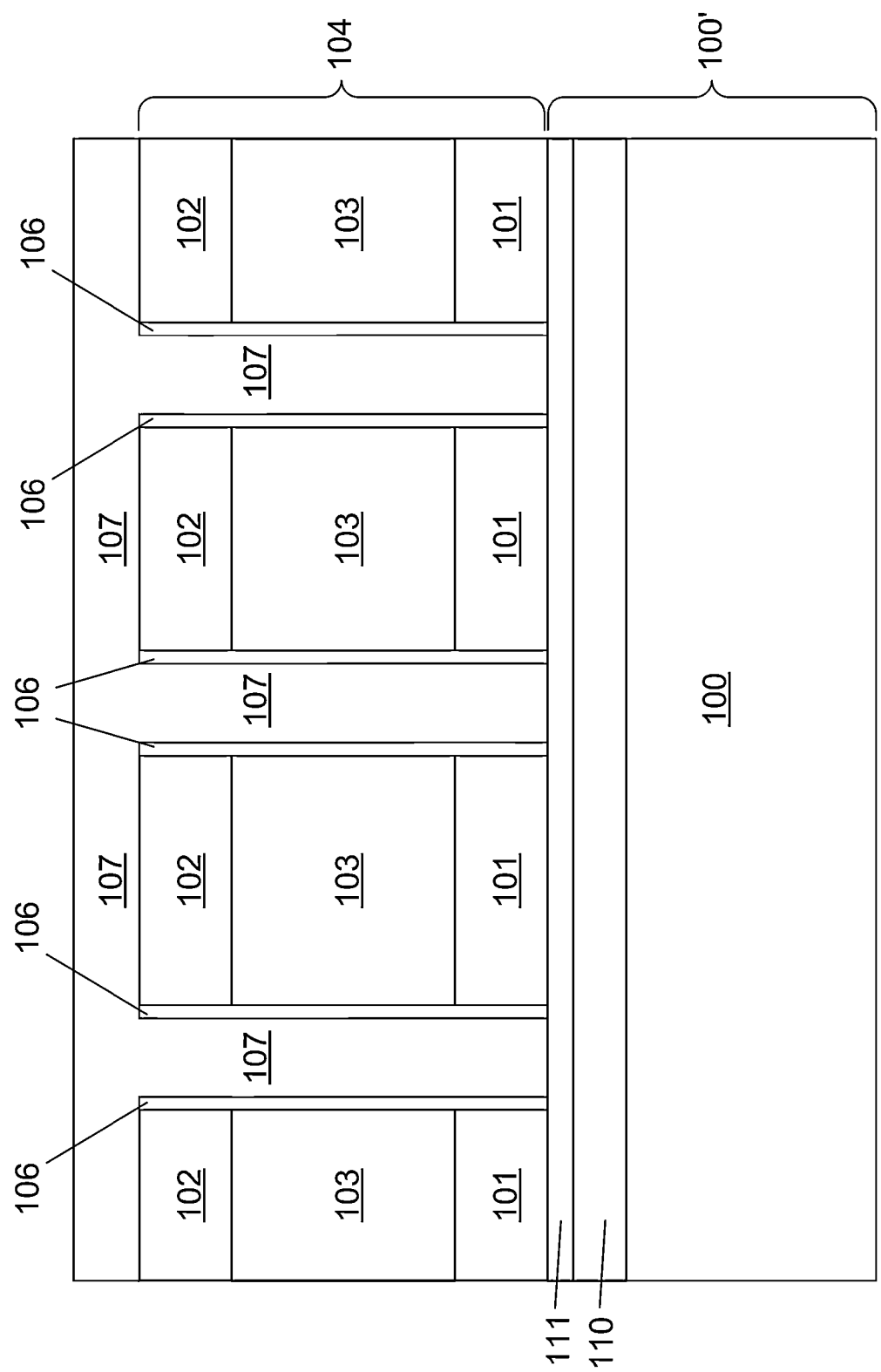

After providing the gate dielectric layer 106 on the sidewall surfaces 105a of each hole or trench 105, a semiconducting material 107 is provided over the stack 104 of layers 101, 102, 103 and into the hole or trench 105 over the dielectric layer 106 as shown in FIG. 7. Formation of the semiconducting material 107 may be achieved using CVD, or more preferably, using low pressure chemical vapour deposition (LPCVD). As shown in FIG. 7, the semiconducting material 107 is also formed on top of the stack 104 of layers 101, 102, 103 and forms a layer of filling material is formed on top of the second or top dielectric layer 102. The semiconducting material is preferably undoped, although low levels of doping may be useful in some applications.

Figure 8:
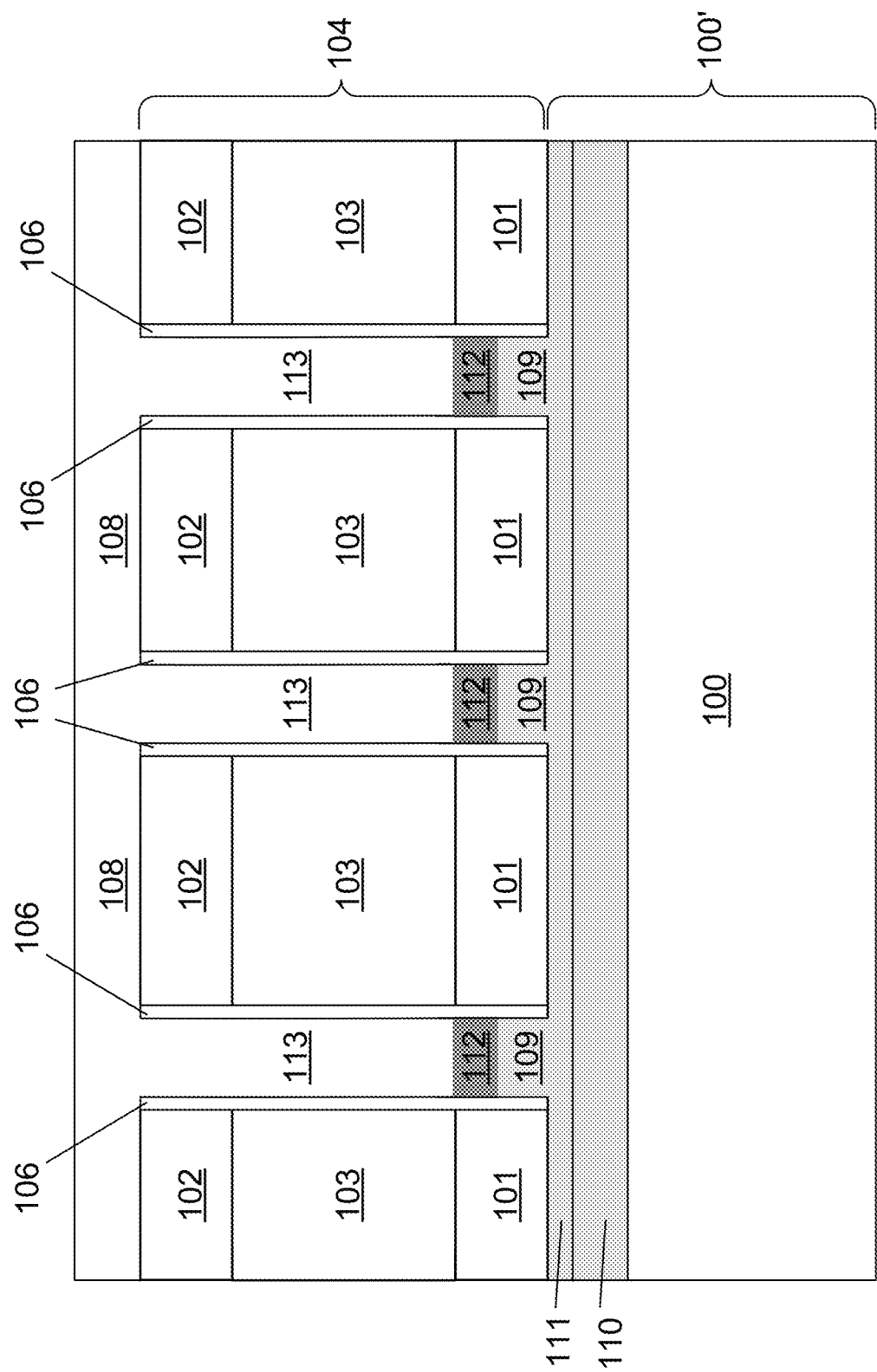

In order to form a source region, the dopants implanted in the doped semiconducting substrate 100' must be activated, that is, annealed, in order to allow the doped semiconducting material to diffuse into the undoped semiconducting material 107 in a bottom part of each hole or trench 105 as shown in FIG. 8.

A first annealing step is provided to form a source region in a bottom part of each hole or trench, the source region comprising a junction between a first source region 109 comprising dopants of the first doping type and a second source region 112 comprising dopants of the second doping type, the second source region 112 being in contact with a middle part 113 of the semiconductor-filled hole or trench (which will serve as the channel region of the vertical semiconductor device as will be described below).

In an example where phosphorus ions are implanted in the first top layer 110 of the doped semiconducting substrate 100' with a doping concentration of about 1 to 2e15 at/cm$^2$, the resulting doping concentration of the first source region 109, after the first annealing step, will become, for example, about 1 to 5e19 at/cm$^3$ (depending on the annealing parameters, such as, annealing time, annealing temperature etc.). In addition, the ions of the second doping type, for example boron ions, which are implanted in the second top layer 111 of the doped semiconducting substrate 100' will diffuse during this first annealing step and give rise to the second source region 112.

The first annealing step may, for example, be a laser anneal at 1050° C. for 2 minutes in a nitrogen (N$_2$) environment. Naturally, the parameters for the first annealing step are determined by the particular vertical semiconductor device to be formed.

As described above, the semiconducting material 107 is preferably undoped so that the middle part 113 of the semiconductor-filled hole or trench (105 in FIGS. 4 to 6) remains substantially the same after annealing to form a vertical channel region for the vertical memory device.

In order to form a drain region for the vertical memory device, an upper semiconducting material layer 108 is formed on top of the second or top dielectric layer 102, as shown in FIG. 8. The upper semiconducting material layer 108 is implanted with dopants of the first doping type and, preferably, with the first doping concentration. Once the holes 105 have been filled with the undoped semiconducting material 107, the remaining semiconducting material 107 can be removed (not shown) before forming the doped semiconducting layer 108 on top of the second or top dielectric layer 102.

Figure 9:
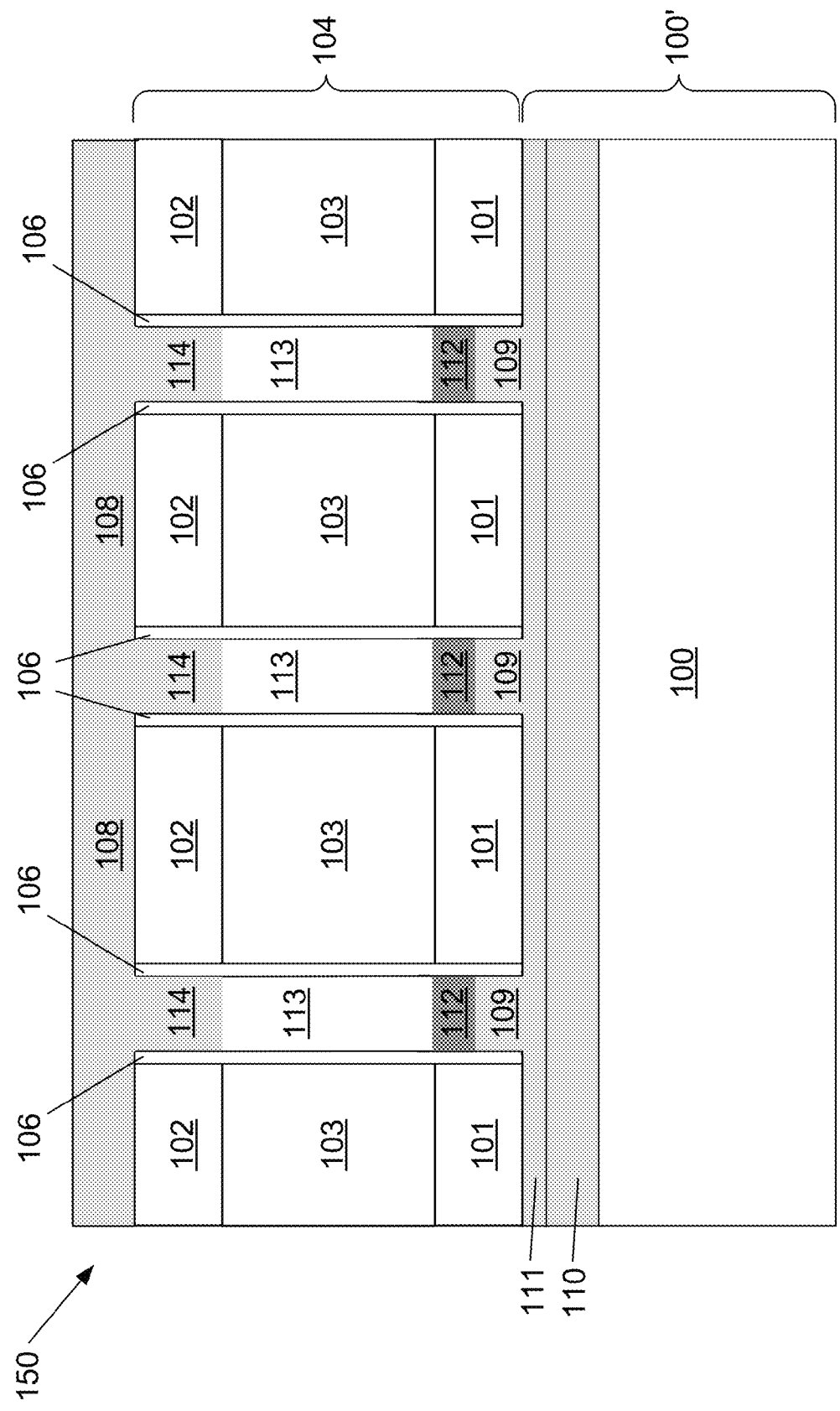

By performing a second annealing step, the dopants in the upper semiconducting layer 108 will diffuse into the hole forming a drain region 114 which forms a junction with the middle part 113 of the hole or trench as shown in FIG. 9. As such, the undoped middle part 113 of the hole serves as the vertical channel region of the device positioned in between the source region 109, 112 and drain region 114.

FIG. 9 illustrates a first embodiment of a vertical memory device 150 in accordance with the present invention. As described above, the device 150 has a doped semiconducting substrate 100' on which a plurality of vertical semiconducting regions is formed by holes through the stack 104 of layers 101, 102, 103. Conductive layer 103 forms a conductive gate layer for each semiconducting region within the vertical memory device 150. Each semiconducting region includes a source region 109, 112, a drain region 114 with a channel region sandwiched between the source region 109, 112 and the drain region 114.

Due to the additional second source region 112 forming a junction with the first source region 109, there is more diffusion and thereby the conduction between the source region 109, 112 and drain region 114 becomes leakier. This is advantageous for the GIDL current which is of importance during the erasing mechanism of the semiconductor device so formed. More specifically, due to the additional implantation, the erase speed and erase window may be enhanced. This is shown in FIG. 12

Figure 12:
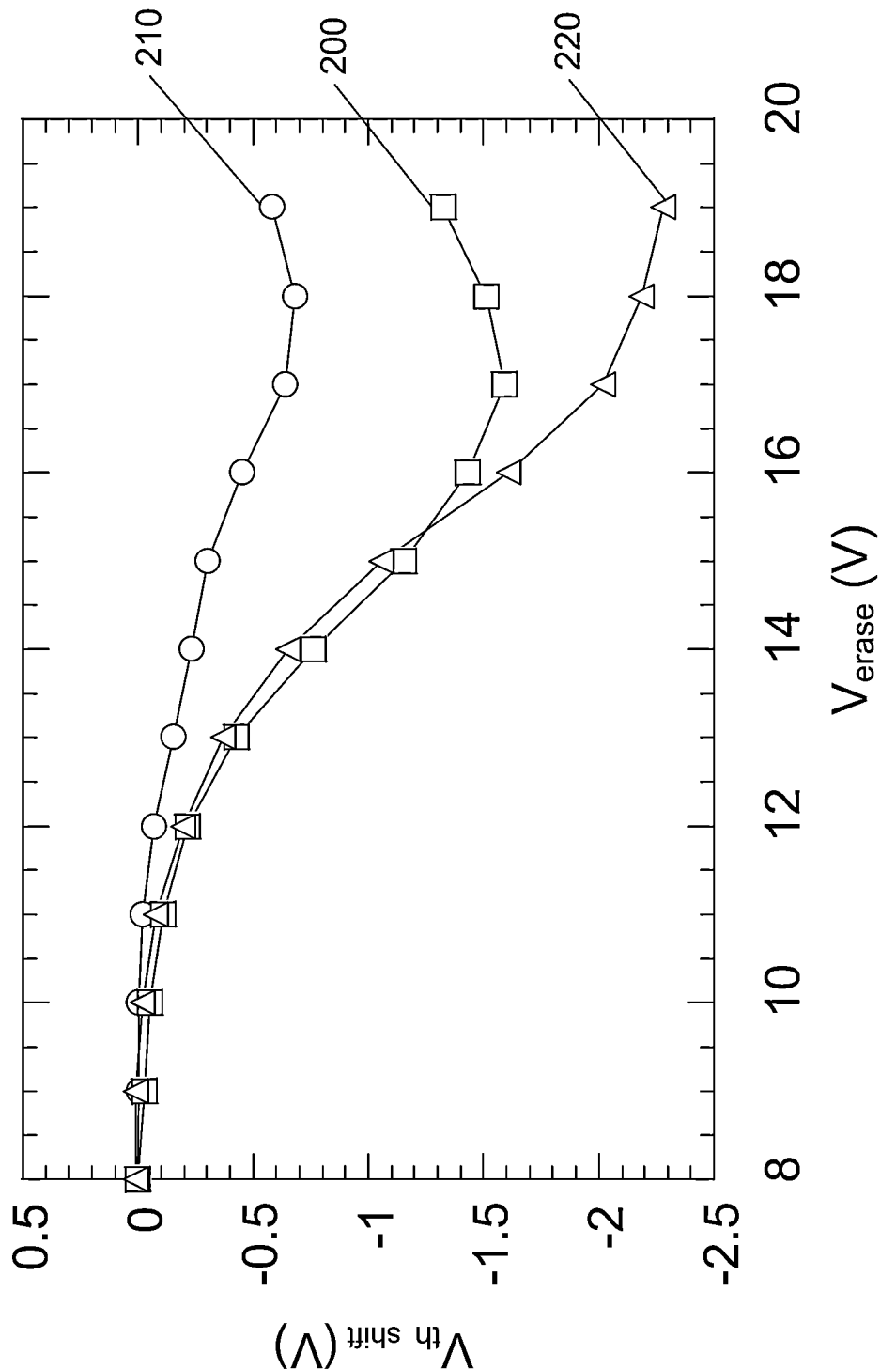
FIG. 12 illustrates a graph of threshold shift voltage against erase voltage for three different implant materials.

In FIG. 12, a graph illustrating the shift of the threshold voltage, $V_{th\ shift}$, of the vertical transistor during the erase operation versus the erase voltage, $V_{erase}$, is shown. The vertical transistor had a 45 nm channel and an erase time of 1 ms. With an extra boron implant, as indicated by curve 200 (squares), the threshold voltage shifts much more than when only phosphorus is implanted as indicated by curve 210 (circles). Curve 220 (triangles) representing a boron only implant is actually the ideal situation in which holes are constantly provided via a p+ contact. In this case, however, there is no junction and therefore no transistor.

The description for manufacturing a vertical semiconductor device as illustrated schematically with FIG. 1 to FIG. 9 is one possibility of different embodiments. It is also possible to provide a source region with dopants of a first doping type with a first doping concentration and a drain region comprising a first drain region comprising dopants of the first doping type with first doping concentration and a second drain region comprising dopants of the second doping type with a second doping concentration as shown in FIG. 10.

Figure 10:
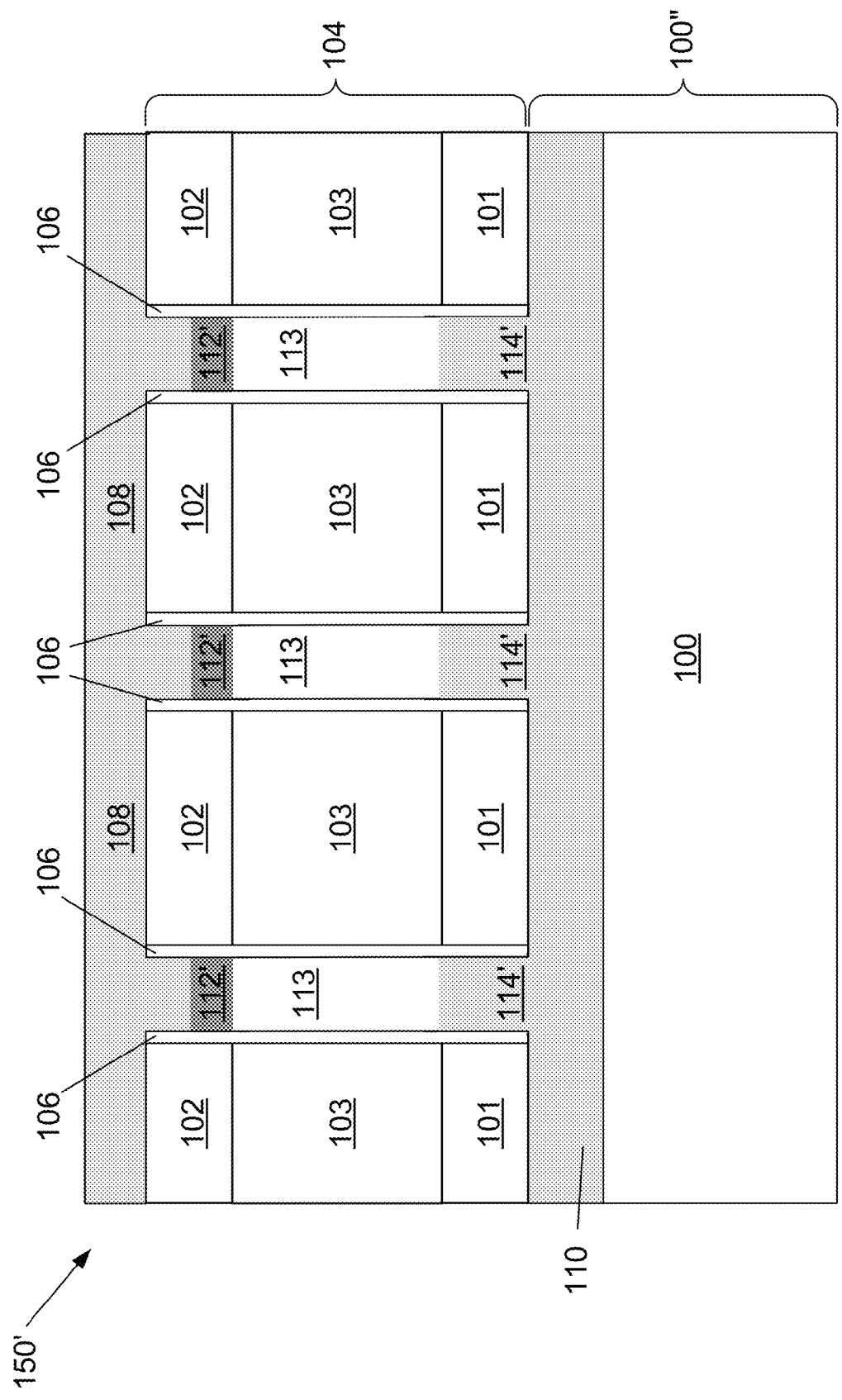
FIG. 10 illustrates an alternative embodiment of the present invention.

In FIG. 10, a second embodiment of a vertical memory device 150' is shown. The vertical memory device 150' is similar to that of the vertical memory device 150 shown in FIG. 9 but in this embodiment, the doped semiconducting substrate 100" comprises the semiconductor substrate 100 and a first top layer 110 only, with dopants from the first top layer 110 diffusing into the holes or trenches to form drain regions 114'. Source regions 112' are formed, in this embodiment, from a layer of semiconducting material (not shown) which corresponds to the second top layer 111 of FIGS. 1 to 9. The doped upper semiconducting material layer 108 then forms the other part of the source region 112' in a similar way to first top layer 110 of the embodiment of FIG. 9. As before, there are two source regions 108, 112' and one drain region 114' in contact with a middle part 111 of the hole which will serve as the channel region of the vertical semiconductor device. This embodiment provides an advantage over the embodiments as illustrated schematically with FIG. 1 to FIG. 9 in that a lower thermal investment is required for the activation or annealing step, and, as such, better controllability of the junction formation may be achieved.

Although in the embodiments of FIGS. 9 and 10, the vertical memory devices 150, 150' have been described as having two-part source regions 109, 112 (FIGS. 9) and 108, 112' (FIG. 10) with a single drain region 114, 114' having a single doping characteristic, it will be appreciated that the drain region 114, 114' may comprise two regions having different doping characteristics with the source region 112, 112' having a single doping characteristic.

In the embodiments described above, phosphorus is used for n-type dopants and boron is used for p-type dopants. However, for a person skilled in the art, it is clear that other possible n-type and/or p-type dopants may be used, for example, arsenic as the n-type dopant.

Using the method as described above, a new vertical cylindrical cell with 25 nm diameter bi-layer poly-silicon channel for 3D NAND Flash memory has been successfully developed. (The term "poly" as used here refers to a polycrystalline semiconductor material.) It achieves minimum cell area (4F$^2$) without the need for pipeline connections. A thin amorphous silicon layer is introduced along with the oxide-nitride-oxide (ONO) gate stack inside the memory hole which protects the tunnel oxide during opening of the gate stack at the bottom of the hole. The smallest working cells have been fabricated with feature size F down to 45 nm corresponding to an equivalent 11 nm planar cell technology node for the case of 16 stacked cells.

In accordance with the present invention, a single cell vehicle comprising a bi-layer poly-silicon channel vertical FLASH device with varying memory hole diameter (typically between 32 and 110 nm) was characterised. The single cell vehicle is relevant since no additional junctions are required for multiple stacked cells as described by Tanaka et al, as discussed above.

As described above, aggressively scaled oxide-nitride-oxide (ONO) memory stack formation was carried out in the etched memory hole starting with 5 nm high temperature deposited oxide (HTO) as a blocking oxide. The nitride thickness was 3 nm and higher. Tunnel oxide was 4 nm HTO. All ONO layers had very good conformal deposition on the sidewall 105a of the hole or trench 105. A good interface between doped semiconducting substrate 100' and semiconductor material 107 or channel poly material in the hole or trench 105 is critical to forming a good bottom junction, and requires a diluted HF (DHF) clean prior to depositing the semiconductor material 107. Therefore, next step is the deposition of a thin (~3 nm) amorphous silicon (a-Si) layer using Silcore precursor material to protect the tunnel oxide from plasma damage during subsequent ONO etch and DHF attack. [Silicore is a trademark of ASM International NV.] After ONO etch, the bi-layer polycrystalline silicon (poly-Si) channel is formed by filling the hole with poly-Si onto the a-Si protection layer. The bottom junction is formed by diffusion of phosphorus (P) from the semiconducting substrate 100' to the poly-Si. A good interface between the semiconducting substrate and the poly-Si is confirmed by observation of silicon regrowth after junction anneal. The top junction is formed by arsenic (As) implantation.

Split capacitance-voltage characteristics from a 10k memory holes device showed symmetric behaviour, indicating good device quality, and single-hole cells having minimum channel diameter (for example, 25 nm) also exhibited well-behaved current-voltage characteristics. In addition, the device was tested using incremental step pulse programming (ISPP) and the channel diameter dependence on ISPP was determined. A 2V program voltage gain was observed when scaling from the channel diameter from 58 nm to 25 nm (equivalent to a hole diameter of from 82 nm to 45 nm) as a result of higher curvature leading to tunnel oxide field enhancement.

In addition, ISPP slightly improved with nitride thickness as it increased from 3 to 4 nm. In a typical erase transient, more negative erase voltage provided faster but less deep erase due to depletion of the $p^+$ poly control gate setting in at more negative voltages and resulting in a shift in balance between hole injection from the substrate and electron injection from the gate. Higher control gate (CG) using a boron (B) implant dose coupled with higher activation anneal temperatures were used to improve the erase performance.

The initial threshold voltage depends on the channel material as it is influenced by traps in the channel. a-Si followed by crystallisation anneal demonstrated lower threshold voltages compared to micro-crystalline (μc-)Si, with poly-Si demonstrating the lowest voltages. Program and erase (P/E) is largely independent of channel material, and a total window under typical P/E conditions is about 6.5V.

Mobility data for different channel materials, important for read performance, were evaluated with μc-Si having the lowest mobility, whereas a-Si channel followed by 650° C., 30 min anneal demonstrating the highest mobility, typically between 6 to 10 $cm^2/Vs$. The positive temperature coefficient indicates emission limited current typical for polycrystalline materials.

The erase function in a BiCS-type structure is controlled by the GIDL current. By enhancing the GIDL by an additional B implant in the $n^+$ junction (cocktail implant), a clear improvement in erase speed and window was obtained. Still deeper erase was seen with $p^+$ drain (B only), representing the asymptotic case of unlimited hole supply. Programmed state retention is only weakly impacted by nitride thickness; the erased state is essentially stable. Analysis of high temperature (200° C.) data revealed only weak temperature activation. This suggests that tunnelling as an important charge loss mechanism in these aggressively scaled deposited ONO stacks.

Retention of the new vertical device was found to be similar to that of a conventional planar device having the same deposited tunnel oxide. This indicates that the oxide quality is maintained on a vertical sidewall. Finally, endurance data demonstrated more than 4V P/E window was maintained after 10k cycles.

An aggressively scaled vertical SONOS cell has been described with channel diameter down to 25 nm showing high potential for Terabit-range NAND Flash. The key improvement is the successful incorporation of a silicon protection layer to allow for bottom junction integration without damaging the tunnel oxide. ONO stack optimisation has also been described with improved erase with cocktail junction implant and mobility improvement by optimised channel materials.

The foregoing description details certain embodiments of the invention. It will be appreciated, however, that no matter how detailed the foregoing appears in text, the invention may be practised in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

What is claimed is:

1. A method comprising:

providing a semiconductor substrate;

providing (i) a first top layer on the semiconductor substrate and (ii) a second top layer on the first top layer, thereby forming a semiconducting substrate comprising the semiconductor substrate, the first top layer, and the second top layer, wherein the first top layer comprises a first type of dopants and the second top layer comprises a second type of dopants different from the first type of dopants;

providing a stack of layers on the semiconducting substrate, wherein the stack of layers comprises at least a first dielectric layer, a conductive layer formed on the first dielectric layer, and a second dielectric layer formed on the conductive layer;

providing a hole in the stack of layers, thereby exposing a portion of the semiconducting substrate;

providing a gate dielectric at least at opposing sidewall surfaces that define the hole;

providing a substantially undoped semiconducting material in the hole, thereby forming a middle region of a vertical memory device in the hole;

providing a doped semiconducting material on the stack and on the substantially undoped semiconducting material in the hole, wherein the doped semiconducting material comprises the first type of dopants;

using a first anneal to form a bottom part of the vertical memory device in the hole, wherein the bottom part comprises (i) a first bottom region adjacent to the second top layer and comprising the first type of dopants and (ii) a second bottom region adjacent to the first bottom region and the middle region and comprising the second type of dopants; and using a second anneal to form a top region of the vertical memory device in the hole, wherein the top region is adjacent to the middle region and comprises the first type of dopants.

2. The method of claim 1, wherein:
the middle region comprises a channel region of the vertical memory device;
the bottom part comprises a source region of the vertical memory device; and
the top region comprises a drain region of the vertical memory device.

3. The method of claim 1, wherein:
the middle region comprises a channel region of the vertical memory device;
the bottom part comprises a drain region of the vertical memory device; and
the top region comprises a source region of the vertical memory device.

4. The method of claim 1, wherein providing the gate dielectric at least at the opposing sidewall surfaces comprises:
providing the gate dielectric at the opposing sidewall surfaces, at a bottom surface including the exposed portion of the semiconducting substrate, and at a top surface of the stack; and
removing the gate dielectric from the bottom surface and the top surface of the stack.

5. The method of claim 1, wherein providing the substantially undoped semiconducting material in the hole comprises:
providing the substantially undoped semiconducting material in the hole and on a top surface of the stack; and
removing the substantially undoped semiconducting material on the top surface of the stack.

6. The method of claim 1, wherein using the first anneal to form the bottom part comprises:
causing a portion of the first type of dopants in the first top layer to diffuse from the first top layer to the first bottom region; and
causing a portion of the second type of dopants in the second top layer to diffuse from the second top layer to the second bottom region.

7. The method of claim 1, wherein using the second anneal to form the top region comprises:
causing a portion of the first type of dopants in the doped semiconducting material to diffuse from the doped semiconducting material to the top region.

8. The method of claim 1, wherein providing the gate dielectric includes providing the gate dielectric at least at opposing sidewall surfaces of the first dielectric layer, the conductive layer, and the second dielectric layer that define the hole.

9. A method comprising:
providing a semiconductor substrate;
providing a top layer on the semiconductor substrate, thereby forming a semiconducting substrate comprising the semiconductor substrate and the top layer, wherein the top layer comprises a first type of dopants;
providing a stack of layers on the semiconducting substrate, wherein the stack of layers comprises at least a first dielectric layer, a conductive layer formed on the first dielectric layer, and a second dielectric layer formed on the conductive layer;
providing a hole in the stack of layers, thereby exposing a portion of the semiconducting substrate;
providing a gate dielectric at least at opposing sidewall surfaces that define the hole;
providing a substantially undoped semiconducting material in the hole, thereby forming a middle region of a vertical memory device in the hole;
using an anneal to form a bottom region of the vertical memory device in the hole, wherein the bottom region is adjacent to the top layer of the semiconducting substrate and the middle region and comprises dopants of the first type of dopants;
providing a first doped semiconducting material on the substantially undoped semiconducting material in the hole, thereby forming a first top region of the vertical memory device in the hole, wherein the first doped semiconducting material comprises a second type of dopants different from the first type of dopants; and
providing a second doped semiconducting material over the first doped semiconducting material, thereby forming a second top region of the vertical memory device in the hole, wherein the second doped semiconducting material comprises the first type of dopants.

10. The method of claim 9, wherein:
the middle region comprises a channel region of the vertical memory device;
the bottom region comprises a source region of the vertical memory device;
the first top region comprises a first drain region of the vertical memory device; and
the second top region comprises a second drain region of the vertical memory device.

11. The method of claim 9, wherein:
the middle region comprises a channel region of the vertical memory device;
the bottom region comprises a drain region of the vertical memory device;
the first top region comprises a first source region of the vertical memory device; and
the second top region comprises a second source region of the vertical memory device.

12. The method of claim 9, wherein providing the gate dielectric at least at the opposing sidewall surfaces comprises:
providing the gate dielectric at the opposing sidewall surfaces, at a bottom surface including the exposed portion of the semiconducting substrate, and at a top surface of the stack; and
removing the gate dielectric from the bottom surface and the top surface of the stack.

13. The method of claim 9, wherein providing the substantially undoped semiconducting material in the hole comprises:
providing an undoped semiconducting material in the hole and on a top surface of the stack; and
removing the undoped semiconducting material on the top surface of the stack.

14. The method of claim 9, wherein using the anneal to form the bottom region comprises:
causing a portion of the first type of dopants in the top layer to diffuse from the top layer to the bottom region.

15. A vertical memory device comprising:
a semiconducting substrate;
a vertical semiconducting region formed on the semiconducting substrate, wherein the vertical semiconducting region comprises a source region, a drain region, and a channel region positioned between the source region and the drain region;
a horizontal stack formed adjacent to the vertical semiconducting region, wherein the horizontal stack comprises a first dielectric layer, a second dielectric layer, and a conductive layer positioned between the first dielectric layer and the second dielectric layer, and wherein the conductive layer is a conductive gate layer; and a charge-trapping layer formed at least between the vertical semiconducting region and the conductive gate layer, wherein at least one of the source region or the drain region comprises (i) a first region approximate to and extending across an entire width of the channel region, and comprising a first type of dopants and (ii) a second region adjacent to the vertical semiconducting region and the first region, and extending across an entire width of the channel region, and comprising a second type of dopants different than the first type of dopants, wherein one of the source region or the drain region includes the first region comprising the first type of dopants and the second region comprising the second type of dopants; and the other of the source region or the drain region comprising the first type of dopants with no substantial amount of the second type of dopants.

16. The device of claim 15, wherein the first type of dopants comprises n-type dopants.

17. The device of claim 16, wherein the n-type dopants comprise at least one of phosphorous or arsenic.

18. The device of claim 15, wherein the first type of dopants comprises p-type dopants, and wherein the p-type dopants comprise boron.

19. The device of claim 15, wherein the channel region is substantially undoped.

* * * * *